United States Patent
Lee et al.

(10) Patent No.: US 9,087,819 B2
(45) Date of Patent: Jul. 21, 2015

(54) SEMICONDUCTOR PACKAGE AND STACK-TYPE SEMICONDUCTOR PACKAGE HAVING THE SAME

(75) Inventors: Gyujei Lee, Seoul (KR); Kang Won Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 234 days.

(21) Appl. No.: 13/334,515

(22) Filed: Dec. 22, 2011

(65) Prior Publication Data

US 2013/0037939 A1  Feb. 14, 2013

(30) Foreign Application Priority Data

Aug. 9, 2011 (KR) .......................... 10-2011-0078852

(51) Int. Cl.
| | |
|---|---|
| *H01L 23/48* | (2006.01) |
| *H01L 23/538* | (2006.01) |
| *H01L 25/065* | (2006.01) |
| *H01L 23/00* | (2006.01) |
| *H01L 23/52* | (2006.01) |
| *H01L 23/29* | (2006.01) |
| *H01L 23/31* | (2006.01) |

(52) U.S. Cl.
CPC .......... *H01L 23/481* (2013.01); *H01L 23/3171* (2013.01); *H01L 23/5386* (2013.01); *H01L 24/13* (2013.01); *H01L 25/0657* (2013.01); *H01L 23/293* (2013.01); *H01L 23/3128* (2013.01); *H01L 23/52* (2013.01); *H01L 23/538* (2013.01); *H01L 23/5384* (2013.01); *H01L 24/14* (2013.01); *H01L 24/16* (2013.01); *H01L 24/17* (2013.01); *H01L 2224/02377* (2013.01); *H01L 2224/0401* (2013.01); *H01L 2224/131* (2013.01); *H01L 2224/13009* (2013.01); *H01L 2224/13014* (2013.01); *H01L 2224/13018* (2013.01); *H01L 2224/13022* (2013.01); *H01L 2224/13024* (2013.01); *H01L 2224/13025* (2013.01); *H01L 2224/13147* (2013.01); *H01L 2224/13184* (2013.01); *H01L 2224/14181* (2013.01); *H01L 2224/16146* (2013.01); *H01L 2224/16237* (2013.01); *H01L 2224/29099* (2013.01); *H01L 2224/73204* (2013.01); *H01L 2225/06513* (2013.01); *H01L 2225/06544* (2013.01)

(58) Field of Classification Search
CPC ... H01L 23/52; H01L 23/538; H01L 23/5384; H01L 23/5386
USPC .......................................... 257/773, 774, 777
See application file for complete search history.

(56) References Cited

U.S. PATENT DOCUMENTS

| | | | |
|---|---|---|---|
| 2003/0049884 A1* | 3/2003 | Lutz ............................. | 438/106 |
| 2009/0008790 A1* | 1/2009 | Lee et al. ...................... | 257/774 |
| 2011/0095436 A1* | 4/2011 | Chen et al. ................... | 257/774 |

* cited by examiner

*Primary Examiner* — Colleen A Matthews
*Assistant Examiner* — William Harriston
(74) *Attorney, Agent, or Firm* — William Park & Associates Ltd.

(57) ABSTRACT

A semiconductor package includes a semiconductor chip having a first surface, a second surface which faces away from the first surface, and through holes which pass through the first surface and the second surface; a dielectric layer formed on one or more of the first surface and the second surface and formed with grooves around the through holes on a fourth surface of the dielectric layer facing away from a third surface of the dielectric layer which is attached to the semiconductor chip; through-silicon vias filling the through holes; and bumps formed on the through-silicon vias and on portions of the dielectric layer around the through-silicon vias and filling the grooves.

24 Claims, 8 Drawing Sheets

# SEMICONDUCTOR PACKAGE AND STACK-TYPE SEMICONDUCTOR PACKAGE HAVING THE SAME

CROSS-REFERENCE TO RELATED APPLICATIONS

The present application claims priority to Korean patent application number 10-2011-78852 filed on Aug. 9, 2011, which is incorporated herein by reference in its entirety.

BACKGROUND OF THE INVENTION

With increasing demand for miniaturized and high-capacity semiconductor package, various techniques for stack-type semiconductor packages are being developed so as to achieve miniaturization, high capacity and mounting efficiency.

The term "stack", which is referred to in the semiconductor industry, means to vertically pile at least two semiconductor chips or packages. Stacking semiconductor chips or packages helps to realize a larger memory capacity and mounting area utilization efficiency of the semiconductor packages.

As an example of a stack-type semiconductor package, a structure using through-silicon vias has been suggested. A stack-type semiconductor package using through-silicon vias provides advantages in that, since electrical connections are formed through through-silicon vias, the operation speed of a semiconductor device can be increased and miniaturization is possible. In the stack-type semiconductor package using through-silicon vias, because signal transfer is implemented through the through-silicon vias, junction reliability is very important.

In order to electrically connect the semiconductor packages to each other, bumps are formed on the upper surface and/or the lower surface of each semiconductor chip in such a way as to be connected to the through-silicon vias. If heat is applied in the course of manufacturing the semiconductor packages, the through-silicon vias and the bumps, which are formed of a metallic substance with a coefficient of thermal expansion (CTE) greater than silicon, may be deformed by heat. As a consequence, cracks may occur in the interface between the through-silicon vias and the bumps, and in a severe case, the bumps and the through-silicon vias may be disconnected. That is, the anti-shearing reliability of the interface between the bumps and the through-silicon vias may become poor.

In addition, an adhesive component, which is formed between semiconductor packages to physically attach a semiconductor package to another semiconductor package, may be trapped between the through-silicon vias (or bumps) of an upper semiconductor package and the bumps (or through-silicon vias) of a lower semiconductor package. As a consequence, after the semiconductor packages are stacked, the electrical connections between the upper and lower semiconductor packages may be disconnected, and thus electrical reliability may deteriorate.

BRIEF SUMMARY OF THE INVENTION

Embodiments of the present invention are directed to a semiconductor package with improved reliability and a stack-type semiconductor package using the same.

In an embodiment of the present invention, a semiconductor package includes: a semiconductor chip having a first surface, a second surface which faces away from the first surface, and through holes which pass through the first surface and the second surface; a dielectric layer formed on any one of the one surface and the other surface and defined with grooves around the through holes on a fourth surface facing away from a third surface which is attached to the semiconductor chip; through-silicon vias filling the through holes; and bumps formed on the through-silicon vias and on portions of the dielectric layer around the through-silicon vias and filling the grooves.

The semiconductor chip may have on the one surface a circuit unit for storing and processing data.

Each of the grooves may have a polygonal or semicircular sectional shape when viewed from the side. Alternatively, each of the grooves may have a width that is greater at a bottom than a top. For example, each of the grooves may have a trapezoidal sectional shape in which a width gradually increases from a top to a bottom when viewed from the side or may have a bulb-like sectional shape which has a neck portion with a linear profile and a circular portion extending downwards from the neck portion.

Each of the grooves may have a closed-loop shape which surrounds a corresponding through-silicon via, when viewed from the top. Alternatively, a plurality of separate grooves may be defined around a corresponding through-silicon via, when viewed from the top.

Each of the bumps may project more on a center portion than on peripheral portions.

The semiconductor package may further include additional bumps formed on center portions of the bumps.

The dielectric layer may include at least any one of an oxide layer and a polymer layer.

In an embodiment of the present invention, a stack-type semiconductor package includes: a plurality of semiconductor packages each including a semiconductor chip having one surface, the other surface which faces away from the one surface, and through holes which pass through the one surface and the other surface, a dielectric layer formed on any one of the one surface and the other surface and defined with grooves around the through holes on a fourth surface facing away from a third surface which is attached to the semiconductor chip, through-silicon vias filling the through holes, and bumps formed on the through-silicon vias and on portions of the dielectric layer around the through-silicon vias and filling the grooves, and stacked such that the through-silicon vias and the bumps of the semiconductor packages are connected to each other; and connection components electrically connecting the bumps and the through-silicon vias of the stack-type semiconductor packages with each other.

The semiconductor chip may have on the one surface a circuit unit for storing and processing data.

Each of the grooves may have a polygonal or semicircular sectional shape when viewed from the side. Alternatively, each of the grooves may have a width that is greater at a bottom than a top. For example, each of the grooves may have a trapezoidal sectional shape in which a width gradually increases from a top to a bottom when viewed from the side or may have a bulb-like sectional shape which has a neck portion with a linear profile and a circular portion extending downwards from the neck portion.

Each of the grooves may have a closed-loop shape which surrounds a corresponding through-silicon via, when viewed from the top. Alternatively, a plurality of separate grooves may be defined around a corresponding through-silicon via, when viewed from the top.

Each of the bumps may project more on a center portion than on peripheral portions.

Each semiconductor package may further include additional bumps formed on center portions of the bumps.

The dielectric layer may include at least any one of an oxide layer and a polymer layer.

The stack-type semiconductor package may further include: a first dielectric layer formed on a lower surface of a semiconductor package positioned lowermost among the stack-type semiconductor packages in such a way as to expose the through-silicon vias of the lowermost semiconductor package; redistribution lines formed under the first dielectric layer and electrically connected to the exposed through-silicon vias of the lowermost semiconductor package; and a second dielectric layer formed under the first dielectric layer including the redistribution lines in such a way as to expose portions of the redistribution lines. Besides, the stack-type semiconductor package may further include: external connection terminals formed on the portions of the redistribution lines which are exposed through the second dielectric line.

The stack-type semiconductor package may further include: a substrate supporting the plurality of semiconductor packages stacked upon one another and having connection pads which are electrically connected to the through-silicon vias of the lowermost semiconductor package among the plurality of semiconductor packages stacked.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
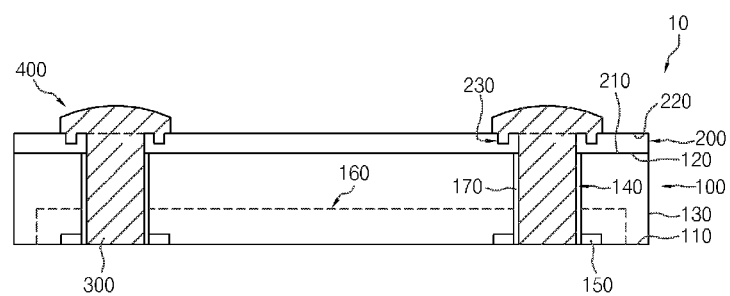
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a semiconductor package 10 in accordance with an embodiment of the present invention includes a semiconductor chip 100, a dielectric layer 200, through-silicon vias 300, and bumps 400.

The semiconductor chip 100 has a first surface 110, a second surface 120, side surfaces 130, through holes 140, bonding pads 150, and a circuit unit 160.

The first surface 110 faces away from the second surface 120, and the side surfaces 130 connect the first surface 110 and the second surface 120. The bonding pads 150 are formed on the first surface 110. The circuit unit 160 is formed on the first surface 110 and is electrically connected to the bonding pads 150. For example, the circuit unit 160 includes elements such as transistors, capacitors and resistors to store and process data.

The through holes 140 pass through the first surface 110 and the second surface 120 of the semiconductor chip 100. In an embodiment of the present invention, the through holes 140 pass through the bonding pads 150 which are formed on the first surface 110. Alternatively, the through holes 140 may not pass through the bonding pads 150 and may pass through portions of the circuit unit 160 which are electrically connected to the bonding pads 150.

When viewed from the top, the through holes 140 may have a circular sectional shape. Alternatively, the through holes 140 may have various sectional shapes such as an elliptical shape, a quadrangular shape and a pentagonal shape. A dielectric layer 170 is formed on the sidewall of the through holes 140. The dielectric layer 170 may be an oxide layer or a nitride layer. Alternatively, the dielectric layer 170 may be an organic layer.

In an embodiment of the present invention, the dielectric layer 200 is formed on the second surface 120 of the semiconductor chip 100, and has a third surface 210 which is attached to the semiconductor chip 100, a fourth surface 220 which faces away from the third surface 210, and grooves 230 which are formed adjacent to the through holes 140 on the fourth surface 220. The dielectric layer 200 may include any one of an oxide layer and a polymer layer.

Figure 4:
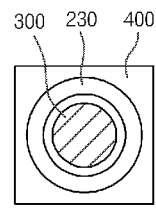
FIG. 4 is a plan view illustrating a through-silicon via, a bump and a groove in accordance with an embodiment of the present invention.
Figure 5:
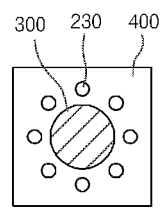
FIG. 5 is a plan view illustrating a through-silicon via, a bump and a groove in accordance with an embodiment of the present invention.

Referring to FIG. 4, when viewed from the top, the grooves 230 may be formed around respective through-silicon vias 300 in closed-loop shapes which surround the respective through-silicon vias 300. Alternatively, as shown in FIG. 5, a plurality of separate grooves 230 may be formed around each through-silicon via 300.

Figure 2:
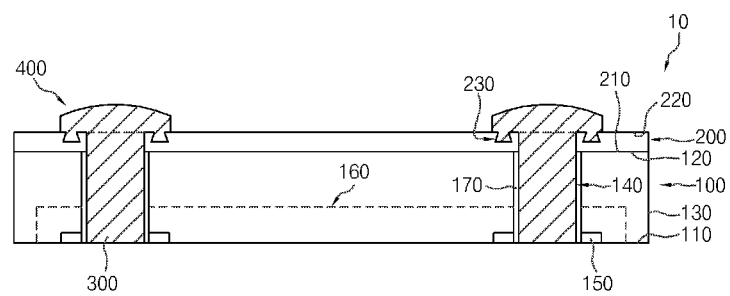
FIG. 2 is a cross-sectional view illustrating a semiconductor package in accordance with an embodiment of the present invention.
Figure 3:
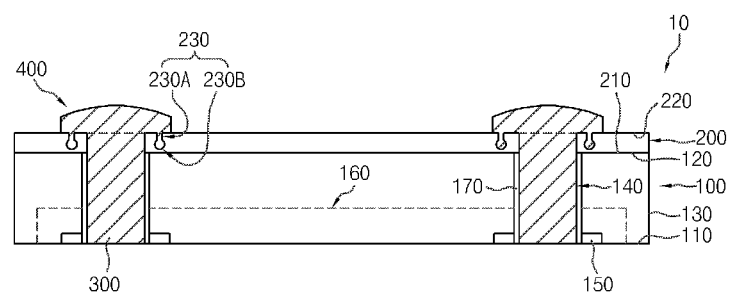
FIG. 3 is a cross-sectional view illustrating a semiconductor package in accordance with an embodiment of the present invention.

In an embodiment of the present invention, when viewed from the side, each groove 230 has a quadrangular cross-sectional shape. Although it is illustrated and described in an embodiment of the present invention that each groove 230 has a quadrangular cross-sectional shape, it is to be noted that the present invention is not limited to such. For example, when viewed from the side, each groove 230 may have a polygonal cross-sectional shape or a semicircular cross-sectional shape. Besides, as shown in FIGS. 2 and 3, when viewed from the side, each groove 230 may have a cross-sectional shape which has a width greater at the bottom than at the top. For example, as shown in FIG. 2, each groove 230 may have a trapezoidal cross-sectional shape in which the width gradually increases from the top to the bottom, or, as shown in FIG. 3, each groove 230 may have a bulb-like cross-sectional shape which has a neck portion 230A with a linear profile and a circular portion 230B extending downwards from the neck portion 230A.

The through-silicon vias 300 fill the through holes 140. As the material of the through-silicon vias 300, copper or tungsten may be used.

The bumps 400 are formed on the through-silicon vias 300 and portions of the dielectric layer 200 around the through-silicon vias 300 and fill the grooves 230. The bumps 400 may be formed of the same material as the through-silicon vias 300, for example, copper or tungsten. The bumps 400, which are formed on the second surface 120 facing away from the first surface 110 formed with the circuit unit 160, may be called 'back-side bumps'.

The bumps 400 may be formed by forming a metal layer on the through-silicon vias 300 and the dielectric layer 200 through a plating process and by patterning the metal layer through a photolithographic process such that the metal layer remains on the through-silicon vias 300 and a portion of the dielectric layer 200 around the through-silicon vias 300. Here, due to the fact that the grooves 230 are formed in the dielectric layer 200, the center portions of the bumps 400 may be formed to be thicker than the edge portions of the bumps 400. In order to form the bumps 400 more projecting on the center portions than on the edge portions, a process for slightly etching the bumps 400 may be performed.

Due to the grooves 230 under the bumps 400, a stress applied to the interface between the bumps 400 and the underlying layer may decrease, thereby improving the anti-shearing reliability of the interface between the bumps 400 and the through-silicon vias 300. In particular, as shown in FIGS. 2 and 3, in the case where the grooves 230 are formed such that the width of each groove 230 is greater at the bottom than at the top, a tensile stress and a compression stress that are applied in the lengthwise direction of the through-silicon vias 300 may decrease.

Figure 6:
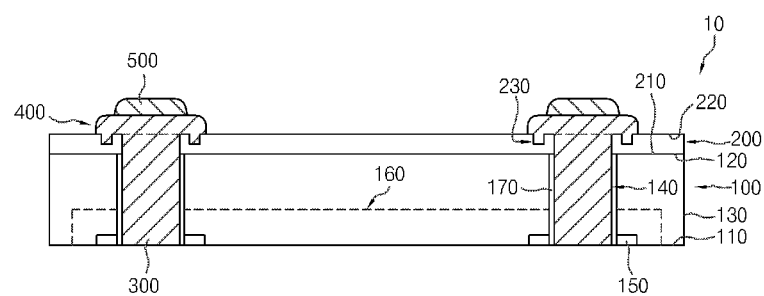
FIG. 6 is a cross-sectional view illustrating a semiconductor package in accordance with an embodiment of the present invention.

FIG. 6 is a cross-sectional view illustrating a semiconductor package in accordance with an embodiment of the present invention.

The semiconductor package in accordance with an embodiment of the present invention has a structure in which additional bumps 500 are formed on bumps 400. A portion of the semiconductor package according to an embodiment of the present invention may have substantially the same configuration as the semiconductor package according to the embodiment described above. Therefore, repeated descriptions for the same components will be omitted herein, and the same terms and the same reference numerals will be used to refer to the same components.

Referring to FIG. 6, a semiconductor package 10 in accordance with an embodiment of the present invention includes a semiconductor chip 100, a dielectric layer 200, through-silicon vias 300, bumps 400, and additional bumps 500.

The additional bumps 500 are formed, for example, on the center portions of the bumps 400. In addition, the additional bumps 500 may be formed of the same material as the bumps 400, for example, copper or tungsten.

Since the additional bumps 500 are formed on the center portions of the bumps 400, a probability of formation of a poor junction caused due to an adhesive component when stacking semiconductor packages may decrease.

Figure 7:
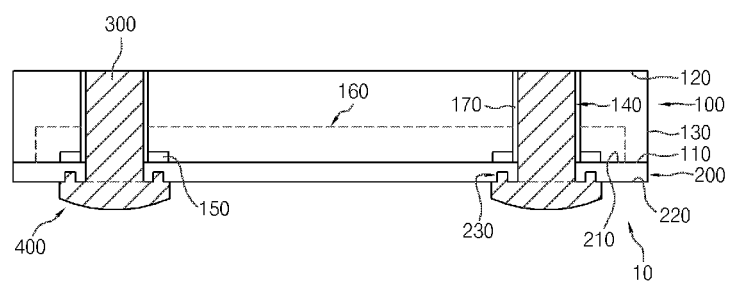
FIG. 7 is a cross-sectional view illustrating a semiconductor package in accordance with an embodiment of the present invention.

FIG. 7 is a cross-sectional view illustrating a semiconductor package in accordance with an embodiment of the present invention.

The semiconductor package in accordance with an embodiment of the present invention has a structure in which a dielectric layer 200 and bumps 400 are formed on a first surface 110 of a semiconductor chip 100. A portion of the semiconductor package according to an embodiment of the present invention may have substantially the same configuration as the semiconductor package according to the embodiment described above. Therefore, repeated descriptions for the same components will be omitted herein, and the same terms and the same reference numerals will be used to refer to the same components.

Referring to FIG. 7, in the present embodiment, a dielectric layer 200 is formed on a first surface 110 of a semiconductor chip 100 on which a circuit unit 160 is formed, and has a third surface 210 which is attached to the semiconductor chip 100, a fourth surface 220 which faces away from the third surface 210, and grooves 230 which are formed on the fourth surface 220 around through holes 140.

Bumps 400 are formed on through-silicon vias 300 and portions of the dielectric layer 200 around the through-silicon vias 300 and fill the grooves 230. The bumps 400, which are formed on the first surface 110 formed with the circuit unit 160, may be called 'front-side bumps'.

Figure 8:
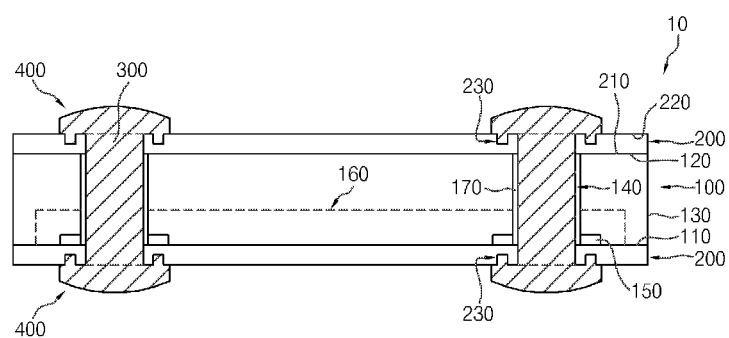
FIG. 8 is a cross-sectional view illustrating a semiconductor package in accordance with an embodiment of the present invention.

FIG. 8 is a cross-sectional view illustrating a semiconductor package in accordance with an embodiment of the present invention.

The semiconductor package in accordance with an embodiment of the present invention has a structure in which dielectric layers 200 and bumps 400 are formed on a first surface 110 and a second surface 120 of a semiconductor chip 100. A portion of the semiconductor package according to an embodiment of the present invention may have substantially the same configuration as the semiconductor package according to the embodiment described above. Therefore, repeated descriptions for the same components will be omitted herein, and the same terms and the same reference numerals will be used to refer to the same components.

Referring to FIG. 8, dielectric layers 200 are respectively formed on a first surface 110 of a semiconductor chip 100 on which a circuit unit 160 is formed and on a second surface of the semiconductor chip 100 which faces away from the first surface 110. Each of the dielectric layers 200 has a third surface 210 which is attached to the semiconductor chip 100, a fourth surface 220 which faces away from the third surface 210, and grooves 230 which are formed on the fourth surfaces 220 around through holes 140.

Bumps 400 are formed on through-silicon vias 300 and portions of the dielectric layers 200 around the through-silicon vias 300 and fill the grooves 230.

Figure 9:
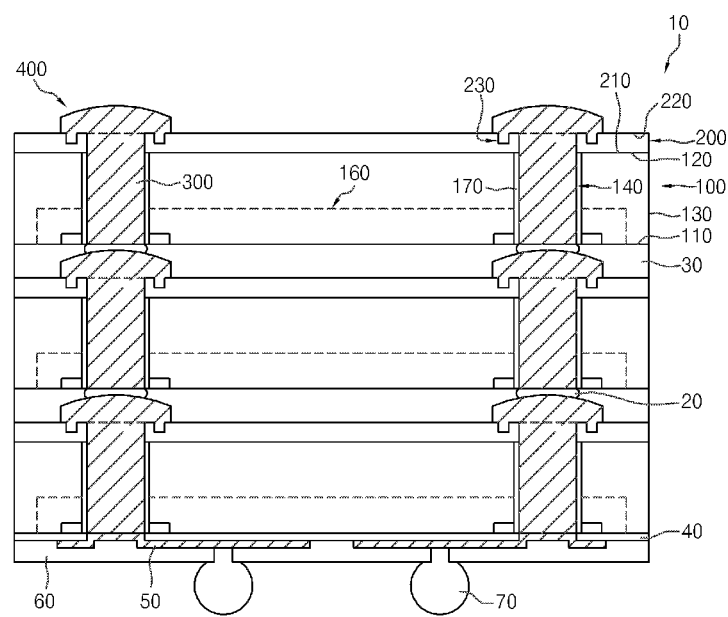
FIG. 9 is a cross-sectional view illustrating a stack-type semiconductor package in accordance with an embodiment of the present invention.

FIG. 9 is a cross-sectional view illustrating a stack-type semiconductor package in accordance with an embodiment of the present invention.

Referring to FIG. 9, semiconductor packages 10 are prepared. Each semiconductor package 10 has through-silicon vias 300, a dielectric layer 200 in which grooves 230 are formed around the through-silicon vias 300, and bumps 400 which are formed on the through-silicon vias 300 and portions of the dielectric layer 200 around the through-silicon vias 300 and fill the grooves 230. The bumps 400 of each semiconductor package 10 and the through-silicon vias 300 of another semiconductor package 10 are connected to each other by the medium of connection components 20. Accordingly, a plurality of semiconductor packages 10, for example, three semiconductor packages 10 are stacked. Adhesive components 30 are interposed between the stack-type semiconductor packages 10. The connection components 20 may include solders, and the adhesive components 30 may include nonconductive pastes.

A first dielectric layer 40 is formed on the lower surface of the semiconductor package 10 positioned lowermost among the stack-type semiconductor packages 10 in such a way as to expose the through-silicon vias 300 of the lowermost semiconductor package 10. Redistribution lines 50, which are electrically connected to the through-silicon vias 300 of the lowermost semiconductor package 10, are formed under the first dielectric layer 40, and a second dielectric layer 60 is formed under the first dielectric layer 40 including the redistribution lines 50 in such a way as to expose portions of the redistribution lines 50. External connection terminals 70 are attached to the portions of the redistribution lines 50 which are exposed through the second dielectric layer 60.

Figure 10:
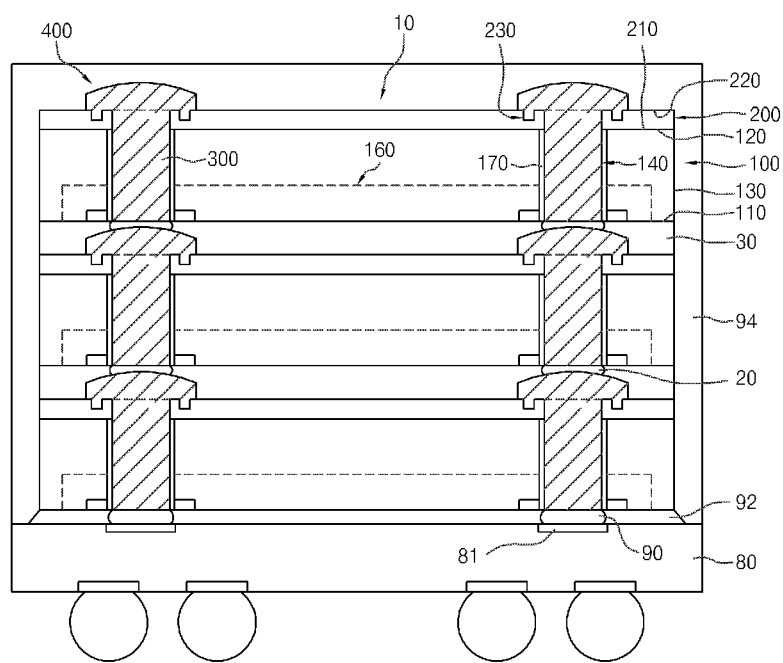
FIG. 10 is a cross-sectional view illustrating a stack-type semiconductor package in accordance with an embodiment of the present invention.

FIG. 10 is a cross-sectional view illustrating a stack-type semiconductor package in accordance with an embodiment of the present invention.

Referring to FIG. 10, semiconductor packages 10 are prepared. Each semiconductor package 10 has through-silicon vias 300, a dielectric layer 200 in which grooves 230 are defined around the through-silicon vias 300, and bumps 400 which are formed on the through-silicon vias 300 and portions of the dielectric layer 200 around the through-silicon vias 300 and fill the grooves 230. The bumps 400 of each semiconductor package 10 and the through-silicon vias 300 of another semiconductor package 10 are connected to each other by the medium of connection components 20. Accordingly, a plurality of semiconductor packages 10, for example, three semiconductor packages 10 are stacked. Adhesive components 30 are interposed between the stack-type semiconductor packages 10. The connection components 20 may include solders, and the adhesive components 30 may include nonconductive pastes.

The stack-type semiconductor packages 10 are mounted to a substrate 80 in such a manner that the through-silicon vias 300 of a semiconductor package 10 positioned lowermost are electrically connected to connection pads 81 of the substrate 80.

The through-silicon vias 300 of the lowermost semiconductor package 10 and the connection pads 81 of the substrate 80 are electrically connected to each other by connection components 90. In order to improve the reliability of joints, an underfill component 92 is interposed between the lowermost semiconductor package 10 and the substrate 80.

A molding part 94 is formed on the upper surface of the substrate 80 including the stack-type semiconductor packages 10.

As is apparent from the above description, according to an embodiment of the present invention, since grooves are formed in a dielectric layer which is formed under bumps, a stress applied to the interface between bumps and through-silicon vias may decrease, whereby the anti-shearing reliability of the interface between the bumps and the through-silicon vias can be improved. Also, because the center portions of the bumps have convex shapes, a probability of formation of an adhesive component between the bumps and the through-silicon vias (or bumps) may decrease when stacking semiconductor packages, whereby the reliability of a stack-type semiconductor package using semiconductor packages can be improved.

The semiconductor packages and the stack-type semiconductor packages described above may be applied to various package modules.

Figure 11:
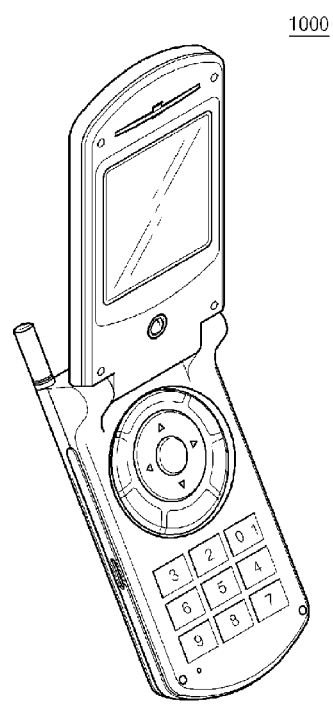
FIG. 11 is a perspective view illustrating an electronic apparatus having the semiconductor package according to an embodiment of the present invention.

FIG. 11 is a perspective view illustrating an electronic apparatus having the semiconductor package according to an embodiment of the present invention.

Referring to FIG. 11, the semiconductor packages according to an embodiment of the present invention may be applied to an electronic apparatus 1000 such as a portable phone. The electronic apparatus 1000 is not limited to the portable phone shown in FIG. 11, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 12:
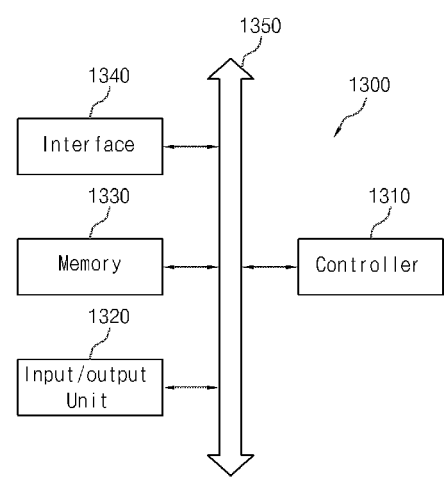
FIG. 12 is a block diagram showing an example of the electronic apparatus having the semiconductor package according to an embodiment of the present invention.

FIG. 12 is a block diagram showing an example of the electronic apparatus having the semiconductor package according to the present invention.

Referring to FIG. 12, an electronic system 1300 may include a controller 1310, an input/output unit 1320, and a memory 1330. The controller 1310, the input/output unit 1320 and the memory 1330 may be coupled to one another through a bus 1350. The bus 1350 serves as a path through which data move. For example, the controller 1310 may include one or more of a microprocessor, a digital signal processor, a microcontroller, and a logic device capable of performing the same functions as these components. The controller 1310 and the memory 1330 may include a semiconductor package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a semiconductor disc device (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. Semiconductor package comprising:
   a semiconductor chip having a first surface, a second surface which faces away from the first surface, and through holes which pass through the first surface and the second surface;
   a dielectric layer formed on one or more of the first surface and the second surface, wherein grooves are formed around the through holes on a fourth surface of the dielectric layer facing away from a third surface of the dielectric layer which is attached to the semiconductor chip, wherein grooves are formed such that inner surfaces formed by the grooves only comprise the dielectric layer, and each of the grooves has a width that is greater at a bottom than a top;
   through-silicon vias filling the through holes; and
   bumps formed on the through-silicon vias and on portions of the dielectric layer around the through-silicon vias and filling the grooves, wherein the bumps are projected more upward on the center portions than on the edge portions.

2. The semiconductor package according to claim 1, wherein the semiconductor chip comprises a circuit unit for storing and processing data on the first surface.

3. The semiconductor package according to claim 1, wherein each of the grooves has a polygonal or semicircular cross-sectional shape when viewed from the side.

4. The semiconductor package according to claim 1, wherein each of the grooves has a trapezoidal cross-sectional shape in which a width gradually increases from a top to a bottom when viewed from the side.

5. The semiconductor package according to claim 1, wherein each of the grooves has a bulb-like cross-sectional shape which has a neck portion with a linear profile and a circular portion extending downwards from the neck portion.

6. The semiconductor package according to claim 1, wherein each of the grooves has a closed-loop shape which surrounds a corresponding through-silicon via, when viewed from the top.

7. The semiconductor package according to claim 1, wherein a plurality of separate grooves are formed around a corresponding through-silicon via, when viewed from the top.

8. The semiconductor package according to claim 1, wherein center portions of the bumps are formed to be thicker than the edge portions of the bumps.

9. The semiconductor package according to claim 1, further comprising:
additional bumps formed on center portions of the bumps.

10. The semiconductor package according to claim 1, wherein the dielectric layer comprises one or more of an oxide layer and a polymer layer.

11. A stack-type semiconductor package comprising:
a plurality of semiconductor packages including a semiconductor chip having a first surface, a second surface which faces away from the first surface, and through holes which pass through the first surface and the second surface, a dielectric layer formed on one or more of the first surface and the second surface and formed with grooves around the through holes on a fourth surface of the dielectric layer facing away from a third surface of the dielectric layer which is attached to the semiconductor chip, wherein grooves are formed such that inner surfaces formed by the grooves only comprise the dielectric layer, through-silicon vias filling the through holes, each of the grooves having a width that is greater at a bottom than a top, and bumps formed on the through-silicon vias and on portions of the dielectric layer around the through-silicon vias and filling the grooves, wherein the bumps are projected more upward on the center portions than on the edge portions, and stacked such that the through-silicon vias and the bumps of the semiconductor packages are coupled to each other; and
connection components electrically connecting the bumps and the through-silicon vias of the stack-type semiconductor packages.

12. The stack-type semiconductor package according to claim 11, wherein the semiconductor chip comprises a circuit unit for storing and processing data on the first surface.

13. The stack-type semiconductor package according to claim 11, wherein each of the grooves has a polygonal or semicircular cross-sectional shape when viewed from the side.

14. The stack-type semiconductor package according to claim 11, wherein each of the grooves has a width that is greater at a bottom than a top.

15. The stack-type semiconductor package according to claim 14, wherein each of the grooves has a trapezoidal cross-sectional shape in which a width gradually increases from a top to a bottom when viewed from the side.

16. The stack-type semiconductor package according to claim 14, wherein each of the grooves has a bulb-like cross-sectional shape which has a neck portion with a linear profile and a circular portion extending downwards from the neck portion.

17. The stack-type semiconductor package according to claim 11, wherein each of the grooves has a closed-loop shape which surrounds a corresponding through-silicon via, when viewed from the top.

18. The stack-type semiconductor package according to claim 11, wherein a plurality of separate grooves are defined around a corresponding through-silicon via, when viewed from the top.

19. The stack-type semiconductor package according to claim 11, wherein center portions of the bumps are formed to be thicker than the edge portions of the bumps.

20. The stack-type semiconductor package according to claim 11, wherein each semiconductor package further includes additional bumps formed on center portions of the bumps.

21. The stack-type semiconductor package according to claim 11, wherein the dielectric layer comprises one or more of an oxide layer and a polymer layer.

22. The stack-type semiconductor package according to claim 11, further comprising:
a first dielectric layer formed on a lower surface of a semiconductor package positioned lowermost among the stack-type semiconductor packages in such a way as to expose the through-silicon vias of the lowermost semiconductor package;
redistribution lines formed under the first dielectric layer and electrically connected to the exposed through-silicon vias of the lowermost semiconductor package; and
a second dielectric layer formed under the first dielectric layer including the redistribution lines in such a way as to expose portions of the redistribution lines.

23. The stack-type semiconductor package according to claim 22, further comprising:
external connection terminals formed on the portions of the redistribution lines which are exposed through the second dielectric layer.

24. The stack-type semiconductor package according to claim 11, further comprising:
a substrate supporting the plurality of stacked semiconductor packages and comprising connection pads which are electrically connected to the through-silicon vias of the lowermost semiconductor package among the plurality of semiconductor packages stacked.

* * * * *